United States Patent [19]

Hopper

[11] Patent Number: 4,878,107
[45] Date of Patent: Oct. 31, 1989

[54] TOUCH SENSITIVE INDICATING LIGHT

[76] Inventor: William R. Hopper, 119 Errol Street, North Melbourne, Victoria 3051, Australia

[21] Appl. No.: 84,795
[22] PCT Filed: Oct. 29, 1986
[86] PCT No.: PCT/AU86/00324
§ 371 Date: Jun. 26, 1987
§ 102(e) Date: Jun. 26, 1987
[87] PCT Pub. No.: WO87/02846
PCT Pub. Date: May 7, 1987

[30] Foreign Application Priority Data

Oct. 29, 1985 [AU] Australia .............. PH3151
Sep. 9, 1986 [AU] Australia .............. PH7909

[51] Int. Cl.$^4$ .................................. H01L 23/28
[52] U.S. Cl. .................................. 357/72; 357/17; 307/116; 361/174; 340/706; 250/221; 220/2.1 R; 341/31
[58] Field of Search ............ 357/17, 25, 26, 72, 357/74, 16; 307/116, 117; 361/173, 174, 178; 340/365; 250/221

[56] References Cited

U.S. PATENT DOCUMENTS

| | | | |
|---|---|---|---|
| 3,372,789 | 3/1968 | Thiele et al. | 250/221 |
| 3,805,347 | 4/1974 | Collins et al. | 357/72 |
| 3,855,606 | 12/1974 | Schoberl | 357/72 |
| 3,922,563 | 11/1975 | Penman | 307/116 |
| 3,944,843 | 3/1976 | Vaz Martins | 307/116 |
| 4,032,963 | 6/1977 | Thome | 357/72 |
| 4,047,075 | 9/1977 | Schoberl | 357/72 |
| 4,152,629 | 5/1979 | Raupp | 307/116 |
| 4,514,276 | 4/1985 | Covington et al. | 357/72 |
| 4,550,310 | 10/1985 | Yamaguchi et al. | 307/116 |
| 4,591,710 | 5/1986 | Komadina et al. | 250/221 |
| 4,629,884 | 12/1986 | Bergström | 340/365 P |
| 4,668,876 | 5/1987 | Skarman | 307/116 |
| 4,737,626 | 4/1988 | Hasagawa | 340/365 P |
| 4,761,637 | 8/1988 | Lugas et al. | 340/365 P |

FOREIGN PATENT DOCUMENTS 0113223 7/1984 European Pat. Off. ........ 340/365 P

OTHER PUBLICATIONS

Ludeman, "Miniature Optical Keyboard", IBM Technical Disclosure Bulletin, vol. 15, No. 11, Apr. 1973, pp. 3348-3349.

Primary Examiner—Rolf Hille
Assistant Examiner—Steven Ho Yin Loke
Attorney, Agent, or Firm—Larson & Taylor

[57] ABSTRACT

A touch sensitive light emitting diode comprising a diode (10) encapsulated in a plastics dome (11) and externally operable touch sensitive switching means positioned within the dome, the switching means including an output (18) to external electronics and the diode providing visual indication of the state of the switching means. The switching means may be a resistive touch switch, a voltage detection touch switch, a capacitance detection touch switch, or a proximity detection touch switch. The switching means may also be in the form of a stress/strain sensitive element (130) or a light sensitive element (71) positioned within the dome (11) to detect an object or finger-tip in proximity to the dome. The light emitting diode may also include an integrated circuit (69) positioned within the dome (11).

20 Claims, 6 Drawing Sheets

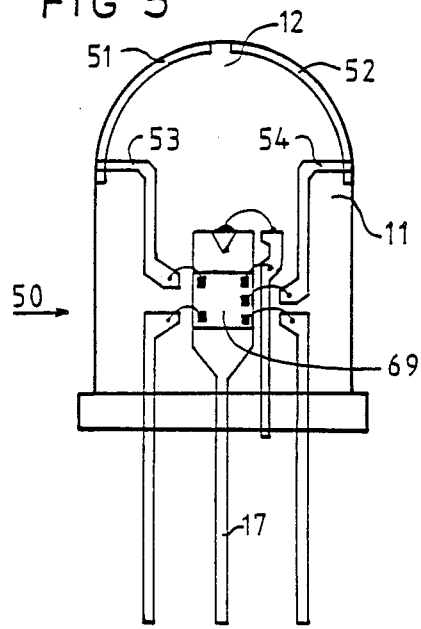
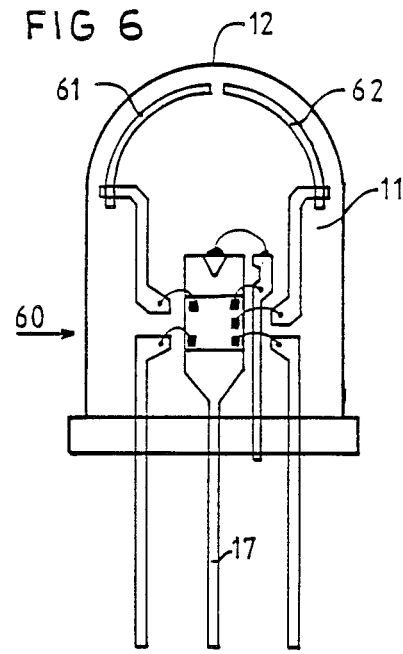
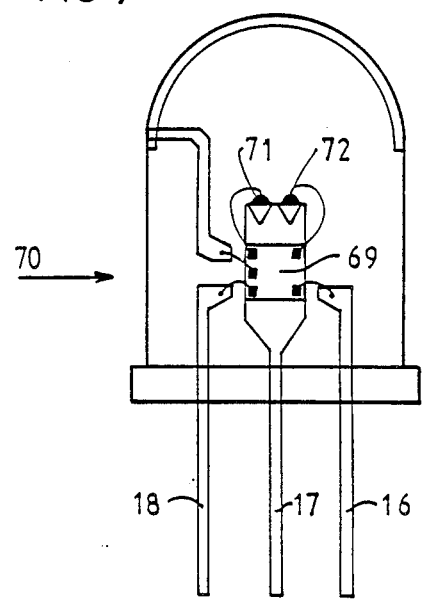

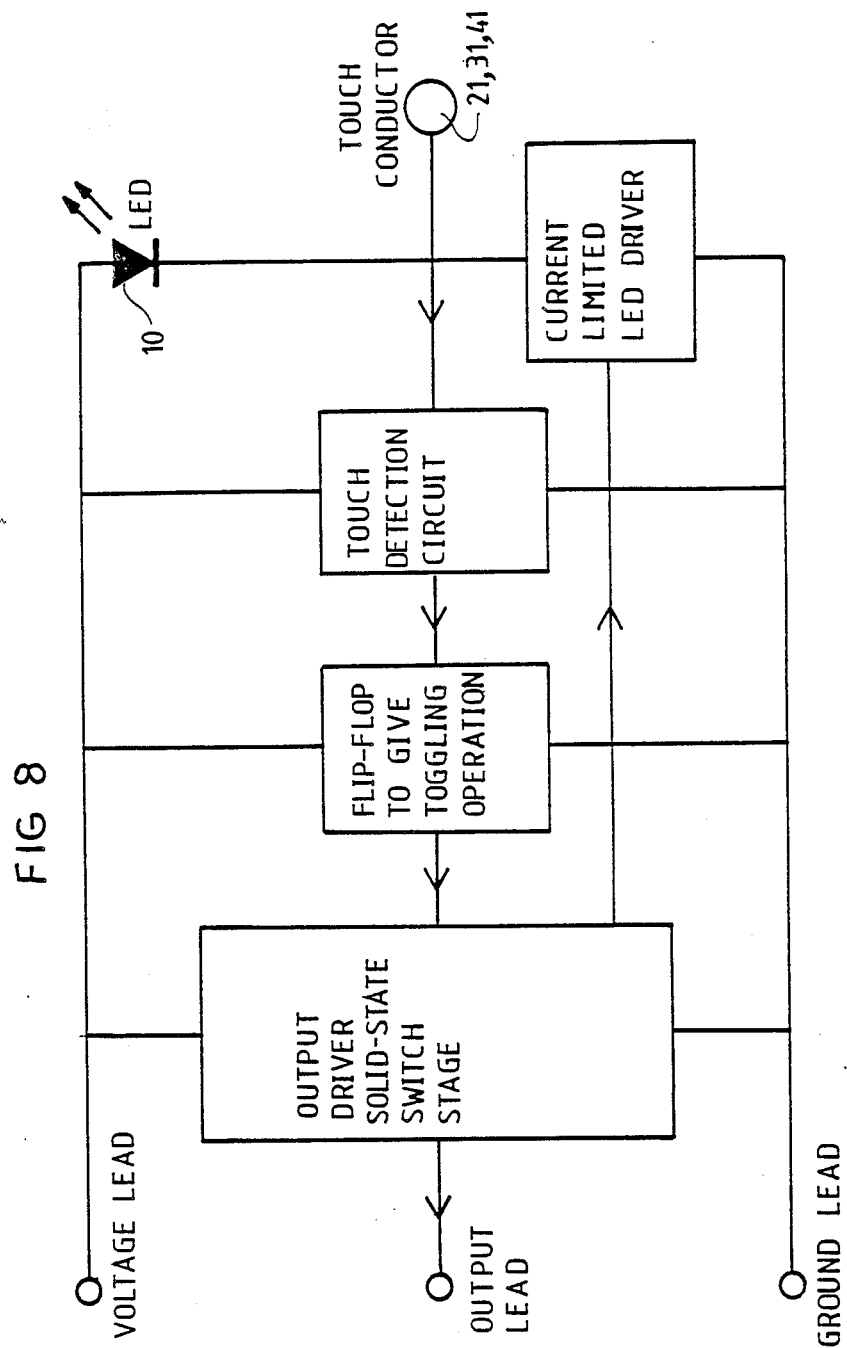

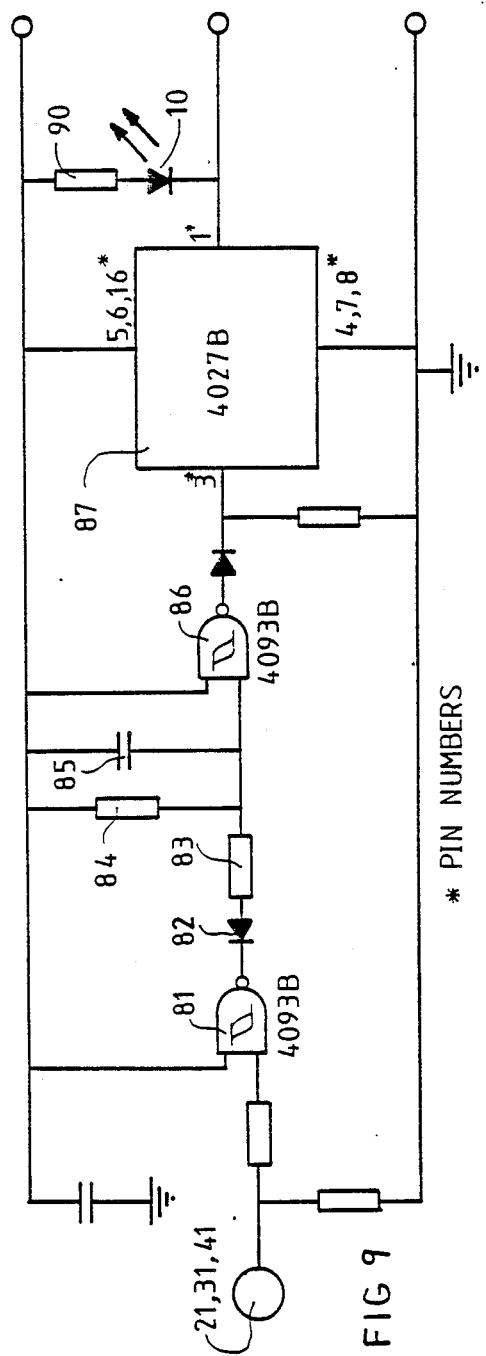
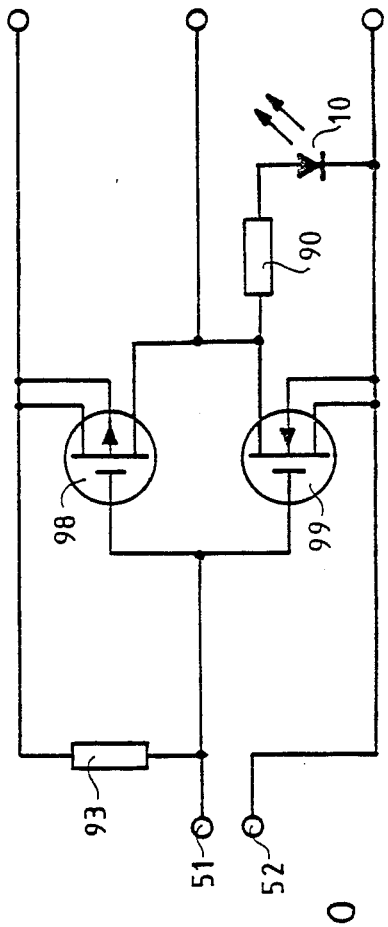
FIG 9
FIG 10
* PIN NUMBERS

A-A

TOUCH SENSITIVE INDICATING LIGHT

INTRODUCTION

This invention relates to a touch sensitive indicating light and more particularly relates to a light emitting diode that incorporates a touch or proximity sensor that operates as switching means.

BACKGROUND OF THE INVENTION

Light emitting diodes known as LEDs have become very popular in the electrical/electronic industries. A light emitting diode is a solid state electronic component typically comprising a forward biased p-n semiconductor junction diode. Light is emitted very close to, or within the junction region as injected holes and electrons diffuse across the junction and combine. The combining holes and electrons release energy and some of this energy is released directly as photons. Light emitting diodes can be fabricated by diffusing p and n type impurities into a suitable semi-conductor to form a junction. A semi-conductor commonly used to fabricate light emitting diodes which emit light in the visible spectrum, is gallium arsenide phosphide.

The diode is conventionally encapsulated in plastics and defines a cylindrical construction with a domed top, the diameter of the assembly being in the order of 5 mm.

Light emitting diodes perform a significant role in the electrical/electronic industry. They provide a simple and effective means of indicating a particular state of a variety of components in an electronic circuit. Their small size and durability makes them ideal for use on instrument panels and on circuit boards. They are frequently used to indicate the state of switching means and are often positioned adjacent to a switch to indicate the state of the switch.

In recent times companies such as Hewlett Packard have produced LEDs that incorporate integrated circuits within the structure of the LED.

SUMMARY OF THE INVENTION

The present invention provides a light emitting diode that has built in switching capacity.

The present invention also provides a touch sensitive light emitting diode comprising a diode encapsulated in a plastics dome and externally operable touch sensitive switching means positioned within the plastics dome, the switching means including an output to external electronics and the diode providing visual indication of the state of the switching means.

Preferably the switching means comprises a conductive region positioned on or adjacent the top of the plastic dome.

The switching means may be a resistive touch switch, a voltage detection touch switch, a capacitance detection touch switch, or a proximity detection touch switch.

In one embodiment the switching means comprises a stress/strain sensitive element positioned within the plastics dome whereby external pressure on the top of the dome is sensed by the stress/strain sensitive element.

The stress/strain sensitive element may comprise a resistor, a piezoelectric or piezoresistive layer, or a semi-conductor piezoresistor or a transistor.

In one other embodiment the switching means comprises a light sensitive element which detects light from the light emitting diode reflected from an object or finger tip in proximity to the top of the plastics dome.

The light sensor may comprise a phototransistor or a photodiode.

The term "dome" as used in this specification relates to the top portion of the diode which could prevent a variety of profiles to the exterior.

DESCRIPTION OF THE DRAWINGS

Various embodiments of the present invention will now be described by way of example only with reference to the accompanying drawings, in which:

FIGS. 1 to 7 are side elevational views illustrating various examples of light emitting diodes that incorporate switching means;

FIG. 8 is a block circuit diagram illustrating one example of the use of an LED incorporating switching means;

FIG. 9 is a circuit diagram illustrating the LED of FIG. 8 used to control a toggling output;

FIG. 10 is a circuit diagram illustrating the use of an LED with switching means to provide a switch with a simple "momentarily on" output;

DESCRIPTION OF PREFERRED EMBODIMENTS

Figure 1:
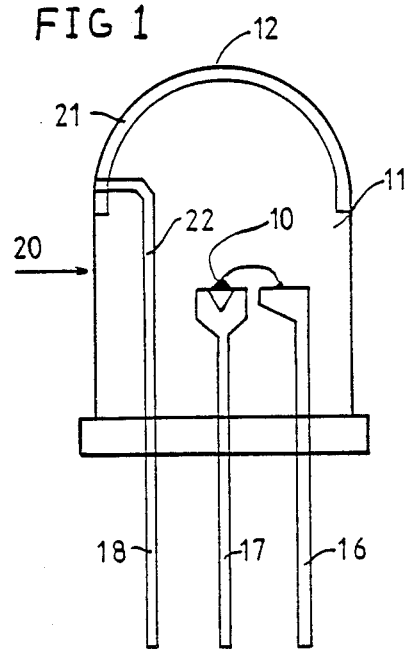

The various embodiments illustrated in the accompanying drawings concern light emitting diodes (LEDs) that incorporate switching means. Throughout the various embodiments the same reference numerals are used for like components. In essence the touch sensitive light emitting diode comprises an LED 10 of one of many known types encapsulated in a translucent plastics dome 11. The dome 11 comprises a domed top 12 and a cylindrical portion 13 that is mounted on a base plate 14. The base plate is usually moulded integrally with the dome and incorporates three spaced apart electrical terminals which project out of the base plate, namely an output terminal 16, a ground terminal 17 and a switch output terminal 18. The plastics dome in which the LED is encapsulated is preferably a thermo-setting resin or produced from the injection moulding of a thermo-plastic. The plastics dome is transparent or translucent and is produced to have an external diameter of approximately 5 mm. This is the standard diameter for conventional LEDs and allows the touch sensitive LED to be used on existing circuitry and facia panels.

The touch sensitive LEDs described in the embodiments illustrated in FIGS. 1 to 7 of the accompanying drawings incorporate four categories of switching means, namely:

(a) Resistive touch switches.

The resistance between two or more electrodes is reduced by the contact of a finger or other conductive material. This change is the switching signal and can be measured and used by switching electronics within, or external to, the touch sensitive LED.

(b) Voltage detection touch switch.

The human body acts as a type of antenna and carries high impedance AC voltages coupled to it by electromagnetic fields from sources such as mains wiring.

These voltages can be detected by a single conductive sensor region on the touch sensitive LED. On contact or close proximity of a finger these voltages can be detected and used as a switching signal. Contact with the conductive sensor region is not a requirement as these voltages may be capacitively coupled from a finger in close proximity to the conductive sensor.

(c) Capacitance detection touch switches.

The human body will act as a small capacitor which is earthed at one end. This effect can be used by an electronic circuit to detect the contact or close proximity of a finger to a conductive sensor. This type of touch switch can operate with a single conductive sensor region on the touch sensitive LED. The change in capacitance between the conductive sensor region and electrical ground caused by the close proximity or contact of a finger is used as the switching signal. This change in capacitance can be detected by such methods as detecting the current from a high frequency oscillator that flows from the conductive sensor to electrical ground or by the degradation or harmonic filtering of an oscillating signal present at the conductive sensor.

(d) Conductor proximity touch switches.

These switches do not require contact and typically use more than one conductive sensor region. In these switches the proximity of a conductor such as a finger changes the inductive or capacitive coupling between two or more conductive regions on or within the plastics encapsulation of the touch sensitive LED.

From the above it should be understood that the expression "touch sensitive" embraces switching means in which either an external element positively touches the sensor or the external element is placed in close proximity to the sensor. The expression "touch sensitive" is not restricted to positive contact.

In FIG. 1 there is illustrated a simple form of touch sensitive LED 20. This touch sensitive LED contains no internal electronics and merely comprises the single light emitting diode 10 encapsulated in a plastics dome 11. The top 12 of the dome is provided with a conductive coating/layer 21 applied over the encapsulating plastics. This layer may be a conductive oxide or conductive plastics. Metallic coatings applied by sputter evaporative or electrolytic processes have also been used to provide the layer. The coating 21 is partially transmissive to light from the light emitting diode 10. A metallic lead 22 is clipped to one edge of the conductive coating 21 and electrically connects this coating to the switch output terminal 18. The touch sensitive LED also incorporates the ground terminal 17 and the positive input voltage terminal 16. In this embodiment the touch sensitive LED would be coupled to external electronic circuitry.

In the embodiments illustrated in FIGS. 2 to 7 the touch sensitive LEDs all incorporate integrated circuits 69 that are bonded and electrically connected to the zero voltage or ground terminal 17. The positive input terminal 16 is coupled to the integrated circuit 69 via a fine gold or metallic wire 68 that is bonded to a metallic frame element 67 of the terminal 16 and to a metallized pad 66 formed on the integrated circuit. Similarly, the output or switch terminal 18 is coupled to the integrated circuit 69 via a fine wire lead 64. A fine wire 63 couples the integrated circuit 69 to the touch sensitive layer 21 via a lead 62.

A metallic strip 61 is coupled to the LED and the integrated circuit for internal construction only. The lead 61 is clipped off close to the base 14 of the encapsulation of the LED.

The integrated circuit and its operation with the touch sensitive LED is described later in this specification.

Figure 3:
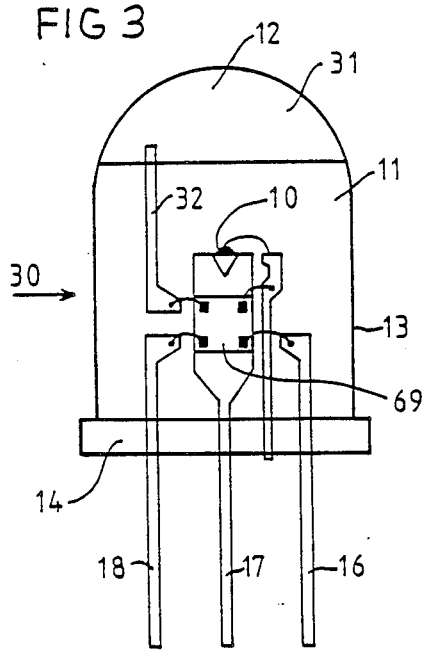

In the embodiment illustrated in FIG. 3, the dome 12 of the touch sensitive LED 30 is provided with a conductive cap 31 made of conductive plastics or other conductive material that is wholly or partially transmissive to light at the frequencies emitted by the light emitting diode 10. The conductive cap 31 is coupled to the integrated circuit 69 via a lead 32.

Figure 4:
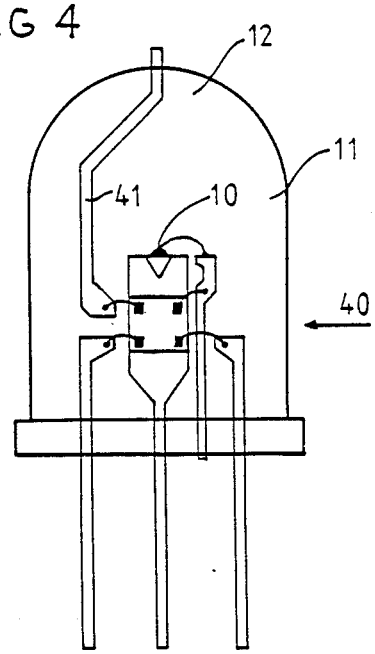

In the embodiment illustrated in FIG. 4, the touch sensitive LED 40, the conductive cap or conductive layer at the top 12 of the dome 11, is replaced by an electrode or lead 41 that extends out through the exterior of the dome to constitute a conductive pin or tab that can be directly touched to activate the LED.

Conductive coatings or layers that can be used include a thin coating of a metal such as gold, silver or nickel or chromium. This layer is made thin enough to be partially transmissive to light from the LED. These coatings can be applied using existing evaporative, sputter or electroplating, or chemical deposition techniques.

Metal oxide films such as films of indium oxide, tin oxide and zinc oxide which are transparent to light and are electrically conductive. These oxides are currently used for this reason in some opto-electronic components. Oxide films may be used to form the conductive touch "pick-up" electrodes. Oxide films are applied using existing evaporating processes. Sometimes these films are "doped" with impurities to modify or adjust their characteristics.

There are also two types of conductive polymers namely:

(i) Normally non-conductive plastics mixed with a filler that produces a conductive result. For example, metal or graphite loaded thermopolymers or resins. These materials are typically opaque but will produce partially transmissive electrodes if used as very thin coatings, and (ii) true conductive polymers such as polythiphene, trans-polyacetylene and polyaniline are electrically conductive. These materials will produce partially transmissive electrodes when used as thin coatings.

In the embodiment illustrated in FIG. 5, the touch sensitive LED 50 has incorporated in the top 12 of the dome 11 two conductive electrodes 51 and 52 in the form of conductive layers on the exterior of the dome. The conductive electrodes 51 and 52 are positioned slightly spaced apart as illustrated in FIG. 5 and are coupled to the integrated circuit 69 via leads 53 and 54. The contact of a finger will change the resistance between the two electrodes, which can be detected by the electronics on the integrated circuit. Also the close proximity of a finger increases the capacitive coupling between the electrodes 51 and 52 and this also can be detected by the electronics on the integrated circuit. If the sensor is capacitive and does not require direct contact, the electrodes may be protected or concealed below the surface of the encapsulating plastic dome as illustrated in the embodiment of FIG. 6 in which the electrode 61 and 62 are positioned a small distance beneath the top 12 of the dome 11.

FIG. 7 illustrates an embodiment where a pair of light emitting diodes 70 and 71 are positioned adjacent one another coupled to the integrated circuit 69 so that, in use, operation of the switching means, which may be in any of the forms described above, causes alternate operation of the light emitting diodes 70 and 71 which may be coloured red or green whereby green "on" indicates that the output lead is zero volts and red "on" indicates that the output lead is at a positive supply voltage. It is understood that a number of light emitting diodes may be incorporated within the one touch sensitive LED to provide a variety of colours that indicate a range of states.

Figure 2:
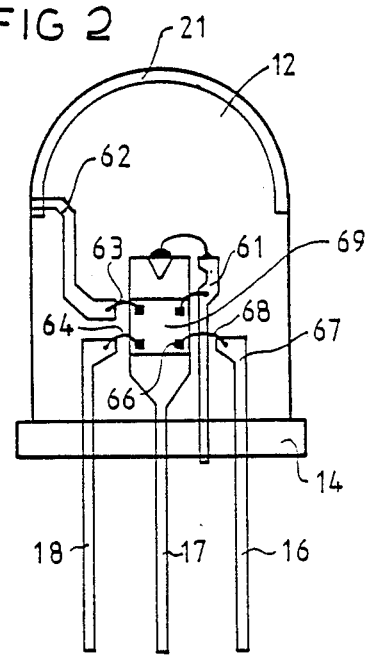

FIG. 8 illustrates a block circuit diagram of the touch sensitive LEDs illustrated in FIGS. 2 and 3 and the associated electronic circuitry that is incorporated within the integrated circuit 69 to provide the desired operation. The LED is illustrated by reference numeral 10 and the touch sensitive pick-up by reference numerals 21 and 31. This circuit includes a constant current LED driver, a touch detection and debouncing circuit, a flipflop to give toggling operation and an output driver stroke solid state switch stage. Examples of electronics that can be used to implement the switch output stage are a transistor, a triac, a diac, an analogue switch or a logic level output such as a CMOS inverter. The components shown in the block diagram terminate at the "voltage in terminal", the "switching output terminal" and the "ground terminal". FIG. 9 is a circuit diagram of a single sensor electrode 21, 31, 41 voltage detecting touch switch. It is shown, built up from existing components and in this form would be suitable as external electronics to run a touch sensitive LED with no internal electronics as shown in FIG. 1. When the electrode 21, is touched the AC electrical signals present in the human body are fed to the input of the Schmitt trigger 81. The output of the Schmitt trigger 81 is then a square wave which is rectified to DC by the diode 82, the resistors 83 and 84 and the capacitor 85. This DC, present while the electrode is touched is deglitched by the second Schmitt trigger 86. The output of the Schmitt trigger 86 drives the clock input to the flip-flop 87. The output 18 of the flip-flop toggles between zero volts and positive supply voltage with each successive touch. When the output 18 is "on", at positive supply voltage this voltage drives the LED 10 through the resistor 90 which limits the current to the LED.

An equivalent to this circuit may be fabricated on an integrated circuit and used in embodiments such as FIG. 2 and FIG. 3.

FIG. 10 is a circuit diagram of a two electrode resistance sensing touch sensitive LED with a simple "on while touched" output 18. This circuit is suitable for fabrication on an integrated circuit, and would be used as shown in FIG. 5.

The circuit consists of complimentary p and n type MOS field-effect transistors 98, 99 arranged as an inverter. The resistor 93 normally holds the input to the inverter high which sets the output 18, low. Finger resistance across the electrodes 51 and 52 pulls the inverter input low which causes the output 18 to lift to close to the positive supply voltage. This voltage will also drive the LED 10 but the current is limited by the resistor 90.

In the embodiments described above the switching means of the touch sensitive LEDs all operate by resistive, voltage detecting inductive or capacitive pick-up.

In another embodiment the switching means may be a light sensor which detects light from the light emitting diode reflected back into the plastic dome by an object or finger in close proximity. Typically the light sensor would be a phototransistor or a photodiode and the device may contain more than one light emitting diodes of different colours. In this way different switch states of the device can be indicated whilst light is always emitted to operate the light sensor. One of the light emitting diodes may emit infra-red light which is not visible and the device appearing to be off.

The physical layout shown in FIG. 7 may be used to implement an optical detection touch sensitive LED. One diode, 71, is a light sensitive photodiode and the second diode, 72, is a light emitting diode.

Light from the light emitting diode 72 is reflected back onto the photodiode 71 by the proximity of a finger tip. The reverse biased current through the photodiode can be used as a switching signal. In this case with only one light emitting diode the different states of the switch are indicated by different intensities or flashing rates of the light emitting diode, but in each case light output is still provided to enable switching, by reflection onto the photodiode from a finger tip.

Typically the photodetector is designed to be sensitive specifically to light from the light emitting diode and is not effected by changes in ambient lighting. The photodetector is not exposed to direct light output from the light emitting diode and so is sensitive to changes in reflected light.

Figure 11A:
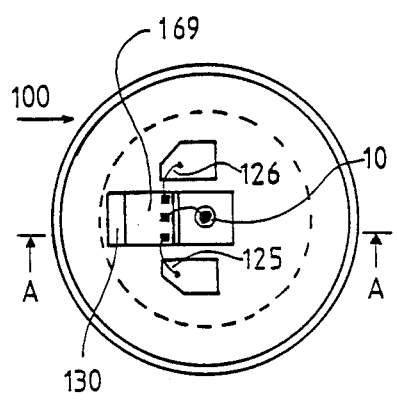
FIGS. 11a, b and c are respectively plan, side and front elevations views of an LED incorporating a stress/strain sensor.

In the embodiment illustrated in FIGS. 11a, b and c, the touch sensitive LED 100 in a manner similar to the earlier embodiments incorporates at least one light emitting diode 10 incapsulated in a dome 11 of a suitable plastics material. The LED incorporates a power input terminal 16, a ground terminal 17 and a switch output terminal 18 as in the earlier embodiments. It is also understood that the touch sensitive light emitting diode incorporates an integrated circuit 169 coupled in a similar manner through gold wires or whiskers to the terminals in the same manner as described in the earlier embodiments.

The major difference between the embodiment illustrated in FIGS. 11a, b and c and the earlier embodiments is that the switching means comprises a stress/strain sensor 130 that is incorporated within the integrated circuit to be sensitive to changes in stress/strain caused by physical contact at the top 12 of the dome 11. To localize the stress/strain when the dome is contacted an annular groove 132 is positioned towards the base of the dome 111 and a banana shaped cut-out 131 provided within the interior of the dome to define a cavity which may be evacuated. The combination of the cavity 131 and the groove 132 causes stress concentrations at the stress/strain sensor to ensure that once the dome is touched the switch is activated.

In another alternative the cavity can be replaced by a compressive insert that again has the effect of causing stress/strain concentration.

Figure 11B:
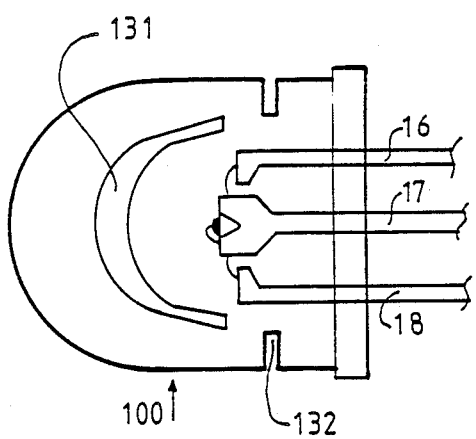
Figure 11C:
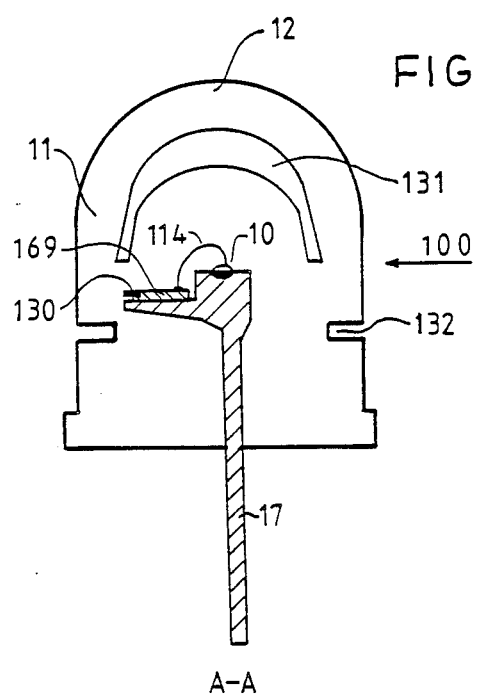

As shown in FIGS. 11 the integrated circuit 169 is coupled to the light emitting diode 10 via a fine wire lead 114. The integrated circuit is also coupled to the metallic output terminal 18 via a fine metallic wire 125 and to the positive power input terminal 16 via a similar fine wire lead 126. The stress/strain sensor 130 may be one of three basic types, namely a resistive element, a piezoelectric element or a capacitive element.

In the case of a capacitive element a diaphragm or cantilever is etched into or mounted on to the surface of the integrated circuit. Strain in the material surrounding the integrated circuit will change the capacitance between metalized conductors on the diaphragm or counterlever and nearby conductors on the integrated circuit. This change in capacitance can also be used as a switching signal to other electronics on the integrated circuit. Integrated circuit accelerometers based on this capacitive principle are available commercially.

In the case of a resistive element the resistive stress sensor is incorporated in the integrated circuit via a set of resistors which are fabricated on the surface of the integrated circuit. These resistors are exposed to strain through the encapsulating plastics when a force is applied to the top of the dome. The resistors change in resistance with strain and this change is detected and interpreted by the other electronic elements that are fabricated on the surface of the integrated circuit. Typically these resistors change resistance due to piezoresistance and are referred to as piezoresistors.

The stress/strain sensor illustrated in FIGS. 11 is fabricated on an integrated circuit. This sensor may be a piezoresistor, or a piezoelectric sensor may be fabricated on the silicon chip by coating the sensor area of the substrate with a thin layer of piezoelectric material such as crystalline aluminium nitrite. In both of the sensor designs described above the sensitivity of the devices can be increased by setting the sensor element areas on a thin diaphragm or a cantilevered area of the silicon chip. To achieve this result the thickness of the silicon wafer is reduced in the sensor region using anisotropic etching micro-machining techniques. By this process the underside of the silicon wafer can be etched away to produce a diaphragm or counterlevered region.

The piezoelectric stress sensor device results in a charge separation when subjected to strain which causes a potential difference across the surfaces of the material. The associated change in electrical resistance of a conductor or semi-conductor is called the piezoresistive effect. Semi-conductor resistors are fabricated on or below the surface of an integrated circuit and exhibit the piezoresistive effect and can be incorporated into a circuit sensitive to small resistor changes to form a strain sensor. These resistors can be fabricated using established diffusion, doping techniques, or by depositing small areas of the integrated circuit surface with a piezoresistive layer such as micro-crystalline silicon. A specific example of a piezoresistive stress sensor is a metal oxide semi-conductor (MOS) field effect transistor. When a stress is applied to a semiconductor there is in effect a change in charge carrier mobility. The drain current of a MOS field effect transistor is proportional to the carrier mobility. In this way a MOS field effect transistor may be constructed on an integrated circuit specifically to act as a piezoresistive based stress/strain sensor.

It is understood that the stress/strain sensor may also incorporate other types such as piezoresistive bridges, buried piezoresistors or a piezoelectric-film field-effect-transistor (PI-FET).

Figure 12:
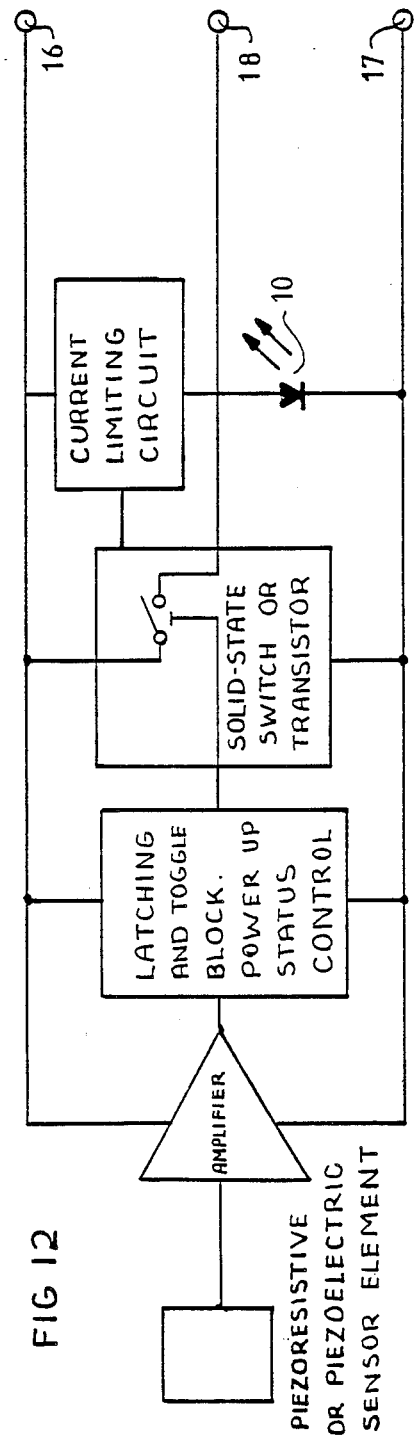
FIG. 12 is a block circuit diagram of an LED incorporating a piezoresistive stress/strain sensor.

In the block diagram of FIG. 12 a touch sensitive LED incorporating a piezoresistive stress/sensor element is illustrated together with the other components of the integrated circuit. The area of the block diagram shown in FIG. 12 is within the dotted line of FIG. 11a. The device has three electrical terminals. Two of the leads 16, 17 are connected across the voltage difference of an external power supply, the third or output lead 18 will toggle between a low and higher voltage level with each successive finger touch. The switching action of the output lead is "deglitched" in that it provides a smooth noise free transition between voltage levels suitable for use with digital electronics.

The light emitting diode 10 is controlled by the integrated circuit and is supplied with power when the output lead is at the higher voltage state. The light emitting diode is supplied with power through a constant current circuit so that it will operate over a range of supply voltages. The supply voltage may vary from three to eighteen volts and the output lead can supply 100 milliamps.

Figure 13:
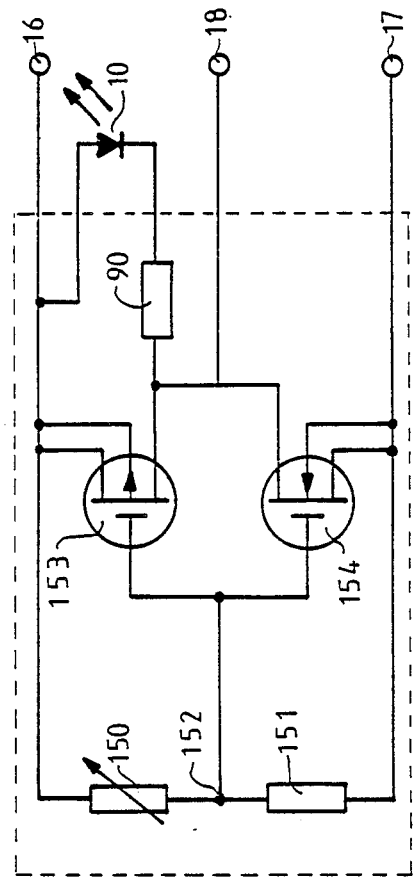
FIG. 13 is a circuit diagram of a LED incorporating a piezoresistive stress/strain sensor.

FIG. 13 is a circuit diagram of a touch switch LED using a stress/strain sensor and with a simple momentarily on output. The part of this circuit within the dotted line boundary can be directly fabricated on an integrated circuit using MOS field-effect transistors 153, 154, and a piezoresistor 150. The circuit consists of complimentary p and n type MOS field-effect transistors arranged as a simple inverter. The piezoresistor 150 and the fixed resistor 151 form a potential divider. The output of this divider 152 is the input to the inverter. Stress on the piezoresistor changes the voltage at the inverter input which can cause the output voltage to change greatly. The output lead also drives the LED 10, via the resistor 90. The resistor 90 limits the maximum current to the LED 10.

Stress/strain sensors fabricated on an integrated circuit are used by companies such as Motorola Inc. and Honeywell to build miniature gas pressure sensors and can be purchased from these companies.

In all of the embodiments described above the touch sensitive light emitting diode incorporates the visual light emitting diode as well as suitable switching means. This combination of components, together with the choice of integrated circuit, allows the device to be used in a variety of operations. Typical functions that may be built into the device by using an appropriated integrated circuit design are:

1. The output lead toggles between a low and a higher ("on") voltage with successive external touches,
2. A single light emitting diode is controlled to indicate the state of the device with the light emitting diode "on" when the output lead is at positive supply voltage and "off" when the output lead is at zero volts state.
3. Two different coloured light emitting diodes are included in the device with one, for example green, indicating that the output lead is at zero volts and the second, for example red, indicating that the output lead is "on".
4. The integrated circuit may include timing functions such as the output lead being on for ten seconds and then switching itself "off" after each push.
5. The device is in a specific known state when it is first powered up.
6. A power down memory capability so that the device will remember its function state when its supply voltage is removed and will resume this condition when next powered up.
7. An analogue voltage output with a magnitude related to the duration or time between the number of touched detections. The intensity of, or the flashing rate of the light emitting device may also be used to indicate the output voltage level.

It is understood that the choice and design of the integrated circuit that detects the function of the touch sensitive LED that is the subject of this invention are well known to those skilled in the art and are encompassed by this invention in its broadest form.

The attached sensitive light emitting diode of the subject application provides the opportunity for the purchase of an off-the-shelf item that incorporates the well known function of an LED whilst at the same time embraces touch control switching with built in electronic integrated circuitry. The touch sensitive LED combines the advantages already known with regard to conventional LEDs as well as the many advantages that acrue to touch sensitive switches. The touch sensitive LED reduces the number of component parts that are required in any electronic circuitry and provides an integral unit encapsulated in plastics to protect against hostile environments such as water and mechanical wear and tear. The touch sensitive LED provides in one unit both the switching and indicating means at one point and thus a number of touch sensitive LEDs may be mounted in an array on a panel or directly on circuit boards for use in many fields such as the automotive industry, laboratory research, hi-fi and consumer equipment, industrial and military applications as well as sophisticated test and measurement equipment.

In some embodiments the function of the touch sensitive LED is increased by the use of transparent or partially light transmissive electrically conductive materials or coatings to make up the conductive touch sensitive region or electrodes. In this way the touch sensitive conductive region may be large for a given plastics encapsulation size and may be on or close to the front surface of the component without obscuring or shadowing the light output from the LED within the device. In this way the LED can be mounted behind the electrode and yet be seen through the electrode, thereby increasing the opportunity to reduce the overall size of the component whilst at the same time producing a clearly visible light output.

The claims defining the invention are as follows;

I claim:

1. A touch sensitive light emitting diode comprising a diode encapsulated in a plastics dome and externally operable touch sensitive switching means encapsulated within the plastics dome, the switching means including an output to external electronics and the diode providing visual indication of the state of the switching means.

2. The touch sensitive light emitting diode according to claim 1, wherein the switching means comprises a conductive region positioned on or adjacent the top of the plastic dome.

3. The touch sensitive light emitting diode according to claim 2, wherein the switching means is a resistive touch switch, a voltage detection touch switch, a capacitance detection touch switch, or a proximity detection touch switch.

4. The touch sensitive light emitting diode according to claim 2, wherein the switching means comprises a conductor that extends through the top of the plastics dome.

5. The touch sensitive light emitting diode according to claim 2, wherein the top of the dome is coated with electrically conductive material that is electrically coupled to the diode.

6. The touch sensitive light emitting diode according to claim 2, wherein the top of the dome is made of conductive plastics electrically coupled to the diode.

7. The touch sensitive light emitting diode according to claim 2, wherein one or more conductive regions are positioned just under the exterior surface of the top of the dome, the conductive regions being coupled to the diode and the switching means operating by capacitive or inductive coupling.

8. The touch sensitive light emitting diode according to claim 2, wherein the conductive region on or within the dome of the diode comprises electrically conducted material which is transparent or partially transparent to light from the light emitting diode positioned behind it.

9. The touch sensitive light emitting diode according to claim 1, wherein the switching means comprises a stress/strain sensitive element positioned within the plastics dome whereby external pressure on the top of the dome is sensed by the stress/strain sensitive element.

10. The touch sensitive light emitting diode according to claim 9, wherein the stress/strain sensitive element comprises a resistor or a set of resistors.

11. The touch sensitive light emitting diode according to claim 9, wherein the stress/strain sensitive element is in the form of a piezoelectric or piezoresistive layer.

12. The touch sensitive light emitting diode according to claim 9, wherein the stress/strain sensitive element is a semi-conductor piezoresistor or a transistor, a part of its structure being a stress/strain effected piezoresistor.

13. The touch sensitive light emitting diode according to claim 9, wherein the stress/strain sensitive element and an associated electronic circuit are fabricated as an integrated circuit.

14. The touch sensitive light emitting diode according to claim 9, wherein the plastics dome includes a groove positioned to ensure that when the top of the dome is touched stress is concentrated in the area where the stress/strain sensitive element is positioned.

15. The touch sensitive light emitting diode according to claim 9 wherein, the plastics dome includes a cavity position to ensure concentration of stress at the position of the stress/strain sensitive element when the top of the dome is touched.

16. The touch sensitive light emitting diode according to claim 9, wherein the stress/strain sensitive element is fabricated on an integrated circuit and the shape or thickness of the integrated circuit is etched to increase the stress/strain sensitivity of the sensitive element.

17. The touch sensitive light emitting diode according to claim 9, wherein the stress/strain sensitive element comprises a capacitor or capacitive element.

18. The touch sensitive light emitting diode according to claim 1, wherein the light switching means comprises a light sensor positioned within the plastics dome to detect light reflected from an object or finger tip in proximity to the dome.

19. The touch sensitive light emitting diode according to claim 1, wherein an integrated circuit is coupled to the diode and the switching means and is encapsulated in the plastics dome.

20. The touch sensitive light emitting diode according to claim 16, wherein the light emitting diode is fabricated on the integrated circuit.

* * * * *